(12) United States Patent
Takenaka et al.

(10) Patent No.: US 8,007,629 B2
(45) Date of Patent: Aug. 30, 2011

(54) METHOD OF MANUFACTURING MULTI-LAYER CIRCUIT BOARD

(75) Inventors: Toshiaki Takenaka, Kyoto (JP); Yoshihiro Kawakita, Osaka (JP); Tadashi Tojyo, Osaka (JP); Yuichiro Sugita, Osaka (JP)

(73) Assignee: Panasonic Corporation, Osaka (JP)

( * ) Notice: Subject to any disclaimer, the term of this patent is extended or adjusted under 35 U.S.C. 154(b) by 385 days.

(21) Appl. No.: 10/595,157

(22) PCT Filed: Sep. 30, 2005

(86) PCT No.: PCT/JP2005/018109
§ 371 (c)(1),
(2), (4) Date: Mar. 9, 2006

(87) PCT Pub. No.: WO2006/040942
PCT Pub. Date: Apr. 20, 2006

(65) Prior Publication Data
US 2008/0251193 A1    Oct. 16, 2008

(30) Foreign Application Priority Data
Oct. 8, 2004   (JP) .................................. 2004/295923

(51) Int. Cl.
*B29C 65/00* (2006.01)
*B32B 37/00* (2006.01)
(52) U.S. Cl. .................... 156/307.7; 156/307.1; 29/830
(58) Field of Classification Search ............. 156/307.1, 156/307.7; 29/830
See application file for complete search history.

(56) References Cited

U.S. PATENT DOCUMENTS

| | | | | |
|---|---|---|---|---|
| 4,081,600 A | * | 3/1978 | Kueneman et al. | 174/251 |
| 4,180,608 A | * | 12/1979 | Del | 428/196 |
| 4,614,559 A | * | 9/1986 | Shirasawa et al. | 156/182 |
| 5,160,567 A | | 11/1992 | Konicek et al. | |
| 5,464,658 A | * | 11/1995 | Yuhas et al. | 427/385.5 |

(Continued)

FOREIGN PATENT DOCUMENTS

CN    87200404 U    2/1988

(Continued)

OTHER PUBLICATIONS

"Composition of Typical Stainless Steels (ASTM A270)" to MSU available as of May 1999 as evidenced by the internet archive.*

(Continued)

*Primary Examiner* — John Goff
(74) *Attorney, Agent, or Firm* — Wenderoth Lind & Ponack, L.L.P.

(57) ABSTRACT

A method of manufacturing a multi-layer circuit board including preparing a laminated member formed of (i) a core circuit board having a circuit pattern thereon and (ii) a prepreg sheet having a through-hole filled with conductive paste, forming a laminated structure such that the laminated member is sandwiched by lamination plates, and applying heat and pressure to the laminated structure. According to this method, selecting a lamination plate that has a thermal expansion coefficient that is equivalent to that of a core circuit board will protect the conductive paste from distortion, thereby offering a high-quality multi-layer circuit board having a reliable connection resistance.

14 Claims, 6 Drawing Sheets

U.S. PATENT DOCUMENTS

| | | | |
|---|---|---|---|
| 5,986,217 A | 11/1999 | Strum | |
| 6,492,030 B1 * | 12/2002 | Hashimoto et al. | 428/447 |
| 6,560,844 B1 * | 5/2003 | Pommer | 29/466 |
| 6,673,190 B2 | 1/2004 | Haas et al. | |
| 7,325,300 B2 | 2/2008 | Tatsumi et al. | |
| 2002/0119665 A1 | 8/2002 | Chapman | |
| 2005/0230072 A1 * | 10/2005 | Levit | 162/146 |

FOREIGN PATENT DOCUMENTS

| | | |
|---|---|---|
| CN | 1457627 A | 11/2003 |
| JP | 57011026 A * | 1/1982 |
| JP | 6-169172 | 6/1994 |
| JP | 6-268345 | 9/1994 |
| JP | 11-251703 | 9/1999 |
| JP | 2001-326458 | 11/2001 |
| TW | 581725 | 11/2000 |
| TW | 486698 | 5/2002 |
| TW | 545101 | 8/2003 |
| WO | 01/63992 | 8/2001 |

OTHER PUBLICATIONS

"Material Expansion Coefficients", pp. 17-1 to 17-12, date 2002.*

Taiwanese Office Action (date unknown) provided by Applicants with the IDS filed Jun. 21, 2011.*

Pages 1, 22, and 29 of TW 200405775 (Apr. 1992) including corresponding partial English translation provided by Applicants with the IDS filed Jun. 21, 2011.*

Supplementary European Search Report issued Nov. 24, 2010 in corresponding EP Application No. 05 78 8243.

* cited by examiner

METHOD OF MANUFACTURING MULTI-LAYER CIRCUIT BOARD

BACKGROUND OF THE INVENTION

1. Field of the Invention

The present invention relates to a method of manufacturing a multi-layer circuit board that has inner via-hole connection via conductive paste.

2. Description of the Related Art

In recent years, as electronic devices are formed into smaller in size and higher in-density, a multi-layer circuit board has been strongly needed not only for industrial use but also for consumer products.

To provide a multi-layer circuit board with high-density, microscopic and multi-layered circuit patterns have been developing. At the same time, a thin circuit board has also been needed.

Such a multi-layer circuit board requires highly reliable interlayer connections in which circuit patterns formed on the layers are connected via inner via-holes. For example, Japanese Patent Unexamined Publication No. H06-268345 introduces a method of manufacturing a high-density circuit board that offers inner via-hole connections via conductive paste filled in via-holes.

Hereinafter will be described a conventional method of manufacturing a multi-layer circuit board, in particular, a four-layered circuit board.

First, a description will be given on the manufacturing process of a double-sided circuit board that is the base of a four-layered circuit board.

FIGS. 5A through 5F illustrate the manufacturing process of a conventional double-sided circuit board, showing step-by-step sectional views until the circuit board is done.

Prepreg sheet 21 is 250 mm×250 mm square and approx. 150 µm in thickness. Prepreg sheet 21 is formed of composite material, for example, a non-woven fabric made of aromatic polyamide fiber impregnated with thermosetting epoxy resin. Mold releasing film 22, which is made of polyethylene terephthalate or the like, has a thickness of approx. 10 µm. On one surface of film 22, a silicone mold releasing agent is applied. Metal foil sheets 25a and 25b, made of Cu or the like, 12 µm-in thickness, cover each surface of prepreg sheet 21. Through-holes 23 in prepreg sheet 21 are filled with conductive paste 24, through which foil sheet 25a establishes electrical connection to foil sheet 25b.

As shown in FIGS. 5A and 5B, through-holes 23 are formed at predetermined positions, by laser processing or the like, in prepreg sheet 21 having mold releasing film 22 on both surfaces.

Through-holes 23 are, as shown in FIG. 5C, filled with conductive paste 24. Specifically, prepreg sheet 21 with through-holes 23 is put on a printer table (not shown), and then conductive paste 24 is directly printed on mold releasing film 22. In the printing process, mold releasing film 22, particularly the upper one, not only serves as a printing mask but also keeps the surface of prepreg sheet 21 clean.

After that, mold releasing film 22 is removed from both surfaces of prepreg sheet 21, as shown in FIG. 5D.

FIG. 5E shows a laminated state in which lamination plate 26b, metal foil 25b, prepreg sheet 21, metal foil 25a, and lamination plate 26a are stacked up in the order. The laminated structure undergoes heat pressing. The application of heat and pressure not only compresses down prepreg sheet 21 as shown in FIG. 5F (where, t2 measures approx. 100 µm), but also attaches metal foil sheets 25a, 25b with prepreg sheet 21. In this way, metal foil sheets 25a and 25b have electrical connections via conductive paste 24 filled in through-holes 23 formed at predetermined positions in the prepreg sheet. Following the above-described steps, a circuit pattern is formed (not shown) by selective etching on metal foil sheets 25a and 25b. The double-sided circuit board of FIG. 5F is thus obtained.

Next, a conventional method of manufacturing a multi-layer circuit board is described. Taking a four-layer circuit board as an example, the sectional views in FIGS. 6A through 6D illustrate a method of manufacturing a multi-layer circuit board.

First, as shown in FIG. 6A, double-sided circuit board 30 as a core circuit board, and prepreg sheets 21a, 21b are prepared. Circuit board 30 having circuit patterns 31a and 31b thereon is formed through the processes from FIG. 5A to FIG. 5F. Prepreg sheets 21a and 21b have through-holes filled with conductive paste 24.

The aforementioned materials are stacked up, as shown in FIG. 6B, together with following components in the order: lamination plate 26b, metal foil 25b made of copper or the like, prepreg sheet 21b, double-sided circuit board 30, prepreg sheet 21a, metal foil 25a, lamination plate 26a. The laminated structure is held by buffer material (not shown) and positioned on a heat press plate (not shown) to undergo heat pressing. With the application of heat and pressure, prepreg sheets 21a and 21b are compressed down (t2 measures approx. 100 µm), metal foil sheets 25a and 25b are bonded with double-sided circuit board 30, and circuit patterns 31a and 31b establish inner-via-hole connections to metal foil sheets 25a and 25b via conductive paste 24.

In the heat pressing process, to protect metal foil sheets 25a and 25b from formation of wrinkles, lamination plates 26a and 26b are usually formed of material having a coefficient of linear expansion equivalent to that of the metal foil (for example, $18 \times 10^{-6}/°$ C. for copper foil).

Etching on selective portions of each surface of metal foil sheets 25a and 25b forms circuit patterns 32a and 32b, respectively. A four-layered circuit board is thus obtained.

To manufacture a circuit board having six or more layers, a core circuit board having four or more layers is needed instead of double-sided circuit board 30. Carrying out the process repeatedly from FIGS. 6A through 6D can produce a multi-layer circuit board having six or more layers.

Prepreg sheet 21 described here has a thickness of 100 µm after being compressed.

As the demand for a thin board grows, a request for a high-quality multi-layer circuit board with slim structure and reliable connection resistance has become stronger.

BRIEF SUMMARY OF THE INVENTION

One embodiment of the present invention is a method of manufacturing a multi-layer circuit board by laminating a core circuit board having a circuit pattern thereon and a prepreg sheet having a through-hole filled with conductive paste. The method contains a heating and pressing process where the laminated structure formed of the core circuit board and the prepreg sheet is sandwiched between a pair of lamination plates and undergoes application of heat and pressure. The lamination plates are formed of material whose thermal expansion coefficient equals to that of the core circuit board. In the heat pressing process, the heat melts the component of epoxy resin contained in a prepreg sheet. At this time, an equal expansion between the lamination plate and the core circuit board in a region where grip-strength is small can protect conductive paste from leaning, thereby offering reliable connection resistance. As a result, a high-quality multi-layer circuit board can be obtained.

Another embodiment of the present invention is a method of manufacturing a multi-layer circuit board, the method containing a step of preparing a core circuit board having a circuit pattern thereon; a step of measuring thermal expansion coefficient of the core circuit board; and a step of selecting a lamination plate that has a thermal expansion coefficient equivalent to that of the core circuit board.

DETAILED DESCRIPTION OF THE INVENTION

As a demand for a thinner circuit board grows, a prepreg sheet with a thickness not greater than 60 μm after being compressed has been needed.

Even when such a thin prepreg sheet with a thickness of 60 μm or less is employed, the required amount of epoxy resin for covering dent portions of metal foil sheets $25a$, $25b$ is the same as that included in a 100 μm-thick prepreg sheet.

Figure 7:
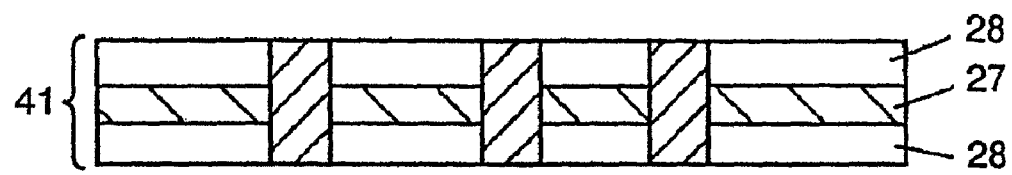
FIG. 7 is a sectional view schematically showing a prepreg sheet in a method of manufacturing a multi-layer circuit board as a comparative example.

Considering the fact above, a 60-μm-thick prepreg sheet 41 is formed so that an aromatic polyamide fiber 27 is sandwiched between thermosetting epoxy resin layers 28, which include a required amount of resin for bonding with a circuit pattern on a core circuit board and metal foil. According to the inventor's examination, the method of manufacturing a multi-layer circuit board as a comparative example shown in FIG. 7 has the following problems.

A conventional manufacturing method employs a relatively thick prepreg sheet that is formed of aromatic polyamide fiber impregnated with epoxy resin. As the thickness of the resin formed on the surface of the prepreg sheet is thin, the resin has a small degree of freedom (in other words, a great flow resistance) even in a melted region of the resin by heat in heat pressing. This conveniently acts to accommodate a difference in expansion ratio between a double-sided circuit board 30 and the metal foil sheets $25a$, $25b$.

Figure 8:
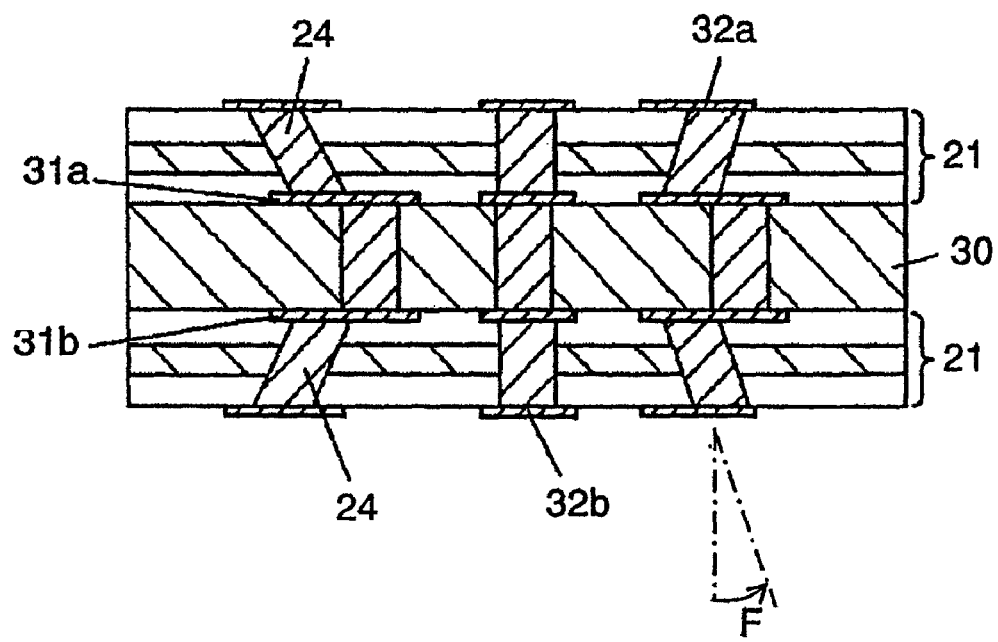
FIG. 8 is a sectional view schematically showing conductive paste in a method of manufacturing a multi-layer circuit board as a comparative example.

On the other hand, when a thin prepreg sheet is used, epoxy resin layers are formed outside prepreg sheet 21 as shown in FIG. 8. The structure increases the degree of freedom (i.e., decreases the flow resistance) of epoxy resin in the melted region of the resin by heat in heat pressing, thereby the difference in thermal expansion coefficient between the double-sided circuit board 30 and the metal foil sheets $25a$, $25b$ is no longer accommodated.

Besides, the inventor noticed that the difference in expansion caused unstable connection resistance. In the structure employing a thin prepreg sheet, conductive paste 24 outwardly leans with respect to the position of conductive paste 24 in a core circuit board. Due to the lean, conductive paste 24 cannot offer consistent connection resistance. The "lean" of conductive paste 24 means that conductive paste 24 inclines toward arrow F, as schematically shown in FIG. 8, from an upright position with respect to double-sided circuit board 30. The more layers a core circuit board contains, the more rigid the core circuit becomes and, the greater the difference in the thermal expansion ratio between the core section and the outer section in the structure becomes. Under the above-mentioned state, it is likely that a via-hole filled with conductive paste therein causes a deformation, i.e., "lean in a via-hole".

Furthermore, the inventor reached the fact below by repeatedly carrying out experiments. Lamination plates 26a, 26b and metal foil sheets 25a, 25b have a coefficient of linear expansion of approx. $18 \times 10^{-6}/°$ C. On the other hand, the coefficient of linear expansion of double-sided circuit board 30 formed of aromatic polyamide fiber measures, although it depends on the remained rate of metal foil, $10 \times 10^{-6}/°$ C.-$12 \times 10^{-6}/°$ C. That is, difference in thermal expansion occurs between double-sided circuit board 30 and, lamination plates (26a, 26b) and metal foil sheets (25a, 25b). Although comparison of thermal expansion is carried out by using coefficient of linear expansion in the embodiment, it is not limited thereto. The comparison can be done by using coefficient of cubical expansion.

Standing on the knowledge above, the inventor created a method of manufacturing a high-quality multi-layer circuit board with reliable connection resistance. In the method, using a selected lamination plate whose thermal expansion coefficient is equivalent to that of a core circuit board can protect conductive paste from distortion in the heat pressing process.

An embodiment of the present invention is a method of manufacturing a multi-layer circuit board formed of a core circuit board having a circuit pattern thereon and a prepreg sheet having a through-hole filled with conductive paste, and the method in which a lamination plate is selected so as to have thermal expansion coefficient equivalent to that of a core circuit board. Even when epoxy resin melt under heat while heat pressing, by virtue of equivalence in thermal expansion coefficient between the lamination plate and the core circuit board in a region where grip strength—a strength that suppresses expansion of a core circuit board—is small, conductive paste is free from a lean (distortion). As a result, a high-quality multi-layer circuit board with reliable connection resistance can be obtained.

Another embodiment of the present invention is a method of manufacturing a multi-layer circuit board in which the resin layers formed on both surfaces of the board has a thickness of not less than 20 μm in total thickness. When the total thickness of the resin layers is 20 μm or more, a prepreg sheet with a thickness of 60 μm or less can be employed. This encourages manufacture of a thin multi-layer circuit board.

Still another embodiment of the present invention is a method of manufacturing a multi-layer circuit board having four or more layers. Selecting a lamination plate whose thermal expansion coefficient equals that of the core circuit board can protect conductive paste from distortion, thereby providing a multi-layer circuit board with a high-quality, and reliable connection resistance. At the same time, a multi-layer circuit board having an additional number of layers can be realized.

Still another embodiment of the present invention is a method of manufacturing a multi-layer circuit board in which a core circuit board is not less than one time as thick as a prepreg sheet. Employing such a thin sheet allows a multi-layer circuit board to have thinner structure.

To be specific, a conventional manufacturing method employs a 150 μm-thick prepreg sheet and 124 μm-thick double-sided core circuit board. That is, the core circuit board is not more than one time as thick as the prepreg sheet. In contrast, according to the method of the present invention, as will be described later, 70 μm-thick prepreg sheet can be employed for an 84 μm-thick double-sided core circuit board. In other words, the method of the present invention can offer a high-quality multi-layer circuit board with reliable connection resistance, even when a core circuit board that is not less than one time as thick as a prepreg is employed.

Still another embodiment of the present invention is a method of manufacturing a multi-layer circuit board formed of a laminated structure whose both surfaces have further metal foil sheets thereover. The structure allows a multi-layer circuit board having a circuit pattern thereon to have additional layers. In general, when a metal foil sheet with a different thermal coefficient is employed, the foil sheet is likely to have wrinkles thereon because the low rigidity of the foil sheet allows the foil sheet to be drawn in a direction as the lamination plate expands. According to the present invention, however, selecting a lamination plate whose thermal expansion coefficient equals to that of the core circuit board can protect metal foil from having wrinkles.

Still another embodiment of the present invention is a method of manufacturing a multi-layer circuit board in which a plurality of core circuit boards, each of which has a circuit pattern thereon, and a plurality of prepreg sheets, each of which has through-holes filled with conductive paste, are alternately laminated. Employing a plurality of core circuit boards and prepreg sheets allows the lamination to be processed in a lump, thereby realizing a multi-layer circuit board having further layers increased in number. At the same time, a multi-layer circuit board with high-quality and reliable connection resistance can be obtained.

Still another embodiment of the present invention is a method of manufacturing a multi-layer circuit board in which a buffer material is disposed outside the laminated structure prior to being placed on a carrying plate. The use of such a buffer material can suppress dimensional change due to thermal expansion of the lamination plate when the lamination plate holds a laminated structure containing many layers. The structure not only offers a multi-layer circuit board with high-quality and reliable connection resistance, but also contributes to improved productivity.

Still another embodiment of the present invention is a method of manufacturing a multi-layer circuit board in which a buffer material is disposed outside the laminated structure prior to being placed on a carrying plate, and the buffer material is made of a material capable of accommodating difference in thermal expansion between the lamination plate and the carrying plate. Even when the lamination plate holds a laminated structure having many layers, the buffer material accommodates difference in thermal expansion, and consequently, changes in dimensions of the lamination plate can be kept small. The structure not only offers a multi-layer circuit board with high-quality and reliable connection resistance, but also contributes to improved productivity. The material capable of "accommodating difference in thermal expansion" is a material that eases a stress generated according to difference in thermal expansion between the lamination plate and the carrying plate. For example, materials having a low elasticity ratio can be used. Commercial buffer material for press molding, such as silicone rubber, fluororubber, and polyester material, can also be used.

Still another embodiment of the present invention is a method of manufacturing a multi-layer circuit board that employs a B-staged prepreg sheet formed of a woven fabric impregnated with thermosetting resin. It is therefore possible to employ a glass fiber woven fabric for the prepreg sheet, so that a physically reinforced multi-layer circuit board can be obtained. Compared to a prepreg sheet made of a non-woven fabric, a woven fabric-made prepreg sheet easily forms a resin layer in a region close to the surface of the prepreg sheet. The structure further enhances the effect of the present invention—considerably effective in protecting conductive paste from distortion, and accordingly, providing a high-quality multi-layer circuit board with reliable connection resistance.

At the same time, it can realize a multi-layer circuit board having an increased number of additional layers.

Still another embodiment of the present invention is a method of manufacturing a multi-layer circuit board that contains the following steps: preparing a core circuit board with a predetermined circuit pattern thereon and measuring a thermal expansion coefficient of the core circuit board; and selecting a lamination plate whose thermal expansion coefficient equals to that of the core circuit board. The thermal expansion coefficient of a core circuit board is influenced by remained copper ratio (i.e., the area ratio of copper foil left on the top layer) of the board, and the remained copper ratio depends on the difference in circuit patterns formed on each board. The method of the present invention can properly select a lamination plate having a thermal expansion coefficient almost the same as that of a core circuit board to be processed together. As a result, a high-quality multi-layer circuit board with reliable connection resistance can be obtained.

Still another embodiment of the manufacturing method of the present invention, the step of measuring a thermal expansion coefficient of the core circuit board carries out measurement of thermal expansion coefficient, by using a thermomechanical measurement apparatus (TMA), at least two positions of a circuit pattern on a core circuit board in a range of room temperature to the heat pressing temperature. With the measurement above, thermal expansion coefficient of core circuit boards with different remained copper ratio can be easily obtained. This enhances productivity and offers a high-quality multi-layer circuit board with reliable connection resistance.

In the description that selecting a lamination plate with a thermal expansion coefficient equivalent to that of a core circuit board, the "equivalent" coefficient means that the thermal expansion coefficient of a lamination plate has a permissible range of ±20% with respect to that of a core circuit board.

According to the present invention, as described above, the manufacturing method employs a lamination plate whose thermal expansion coefficient equivalent to that of a core circuit board. In heat pressing, even when epoxy resin melts under heat while pressing, by virtue of equivalent in expansion rate between the lamination plate and the core circuit board in a region with small grip strength, conductive paste is free from a lean (distortion). As a result, a high-quality multi-layer circuit board with reliable connection resistance can be obtained.

First Exemplary Embodiment

Hereinafter will be described a method of manufacturing a multi-layer circuit board, in particular, a four-layer circuit board, with reference to FIGS. 1 and 2. For clear understanding on components, some drawings have views enlarged in the vertical direction of the laminated structure.

FIGS. 1A through 1D are sectional views illustrating the manufacturing process of a four-layer circuit board. FIGS. 2A through 2F are sectional views illustrating the manufacturing process of a core circuit board that is used for the four-layer circuit board of the present invention.

Here will be described a method of manufacturing a double-sided circuit board used for the core circuit board with reference to FIGS. 2A through 2F and FIG. 3.

Prepreg sheet 1 is a B-staged composite material formed of a non-woven fabric having aromatic polyamide fiber impregnated with thermosetting epoxy resin. Prepreg sheet 1 is 250 mm×250 mm square with a thickness (represented by t1 in FIG. 2A) of approx. 70 μm. As shown in FIG. 3, prepreg sheet 1 is so formed that aromatic polyamide fiber 7 is sandwiched between epoxy resin layers 8 each of which measures approx. 10 μm in thickness. That is, the total thickness of epoxy resin layers 8 is approx. 20 μm. Besides, prepreg sheet 1 has through-holes filled with conductive paste 4 at determined positions.

Figure 2A:
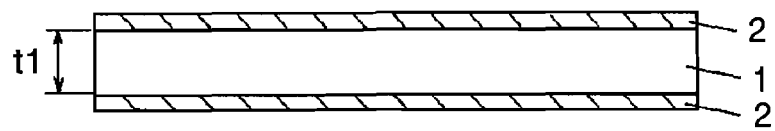
FIG. 2A shows a sectional view of another board material in the method of manufacturing a multi-layer circuit board of the embodiment.
Figure 2B:
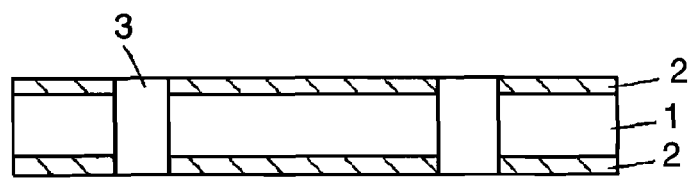
FIG. 2B shows a sectional view of the board material in the method of manufacturing a multi-layer circuit board of the embodiment.
Figure 2C:
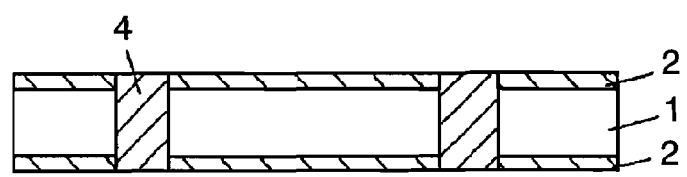
FIG. 2C shows a sectional view of the board material in the method of manufacturing a multi-layer circuit board of the embodiment.
Figure 3:
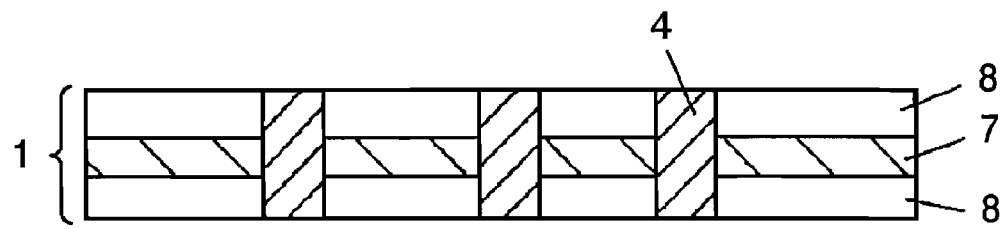
FIG. 3 is a sectional view schematically showing a prepreg sheet of the embodiment of the present invention.

In prepreg sheet 1 shown in FIG. 2A, mold releasing film 2 is attached on both surfaces of sheet 1. Through-holes 3 are formed by laser processing or the like in predetermined positions of prepreg sheet 1, as shown in FIG. 2B. Next, through-holes 3 are filled with conductive paste 4, as shown in FIG. 2C.

Specifically, prepreg sheet 1 with through-holes 3 is put on a printer table (not shown), and then conductive paste 4 is directly printed on mold releasing film 2. Mold releasing film 2, particularly the one attached on the top surface of the prepreg sheet 1, not only serves as a printing mask but also keeps the surface of prepreg sheet 1 clean.

Figure 2D:
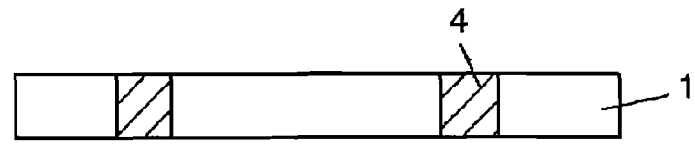
FIG. 2D shows a sectional view of the board material in the method of manufacturing a multi-layer circuit board of the embodiment.

After that, mold releasing film 2 is removed from both surfaces of prepreg sheet 1, as shown in FIG. 2D.

Figure 2E:
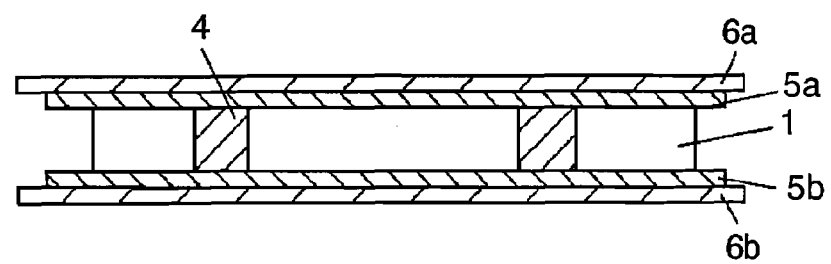
FIG. 2E shows a sectional view of the board material in the method of manufacturing a multi-layer circuit board of the embodiment.

FIG. 2E shows a laminated state in which lamination plate 6b, metal foil 5b made of copper or the like, prepreg sheet 1, metal foil 5a, and lamination plate 6a are stacked up in the order. The laminated structure undergoes heat pressing.

Figure 2F:
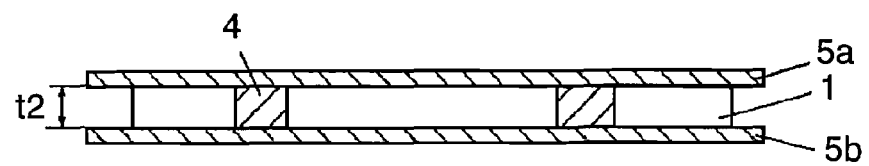
FIG. 2F shows a sectional view of the board material in the method of manufacturing a multi-layer circuit board of the embodiment.

FIG. 2F shows the laminated structure from which lamination plates 6a and 6b are removed after the completion of applying pressure. The application of heat and pressure not only compresses down prepreg sheet 1 (t2 measures approx. 60 μm), but also attaches metal foil sheets 5a, 5b with prepreg sheet 1. Through the process, metal foil sheets 5a and 5b have electrical connections via conductive paste 4 filled in through-holes 3 formed at predetermined positions in the prepreg sheet.

Following to above, a circuit pattern is formed (not shown) by selective etching on metal foil sheets 5a and 5b. The double-sided circuit board used as a core circuit board is thus completed.

Now will be described on manufacturing a four-layer circuit board.

Figure 1A:
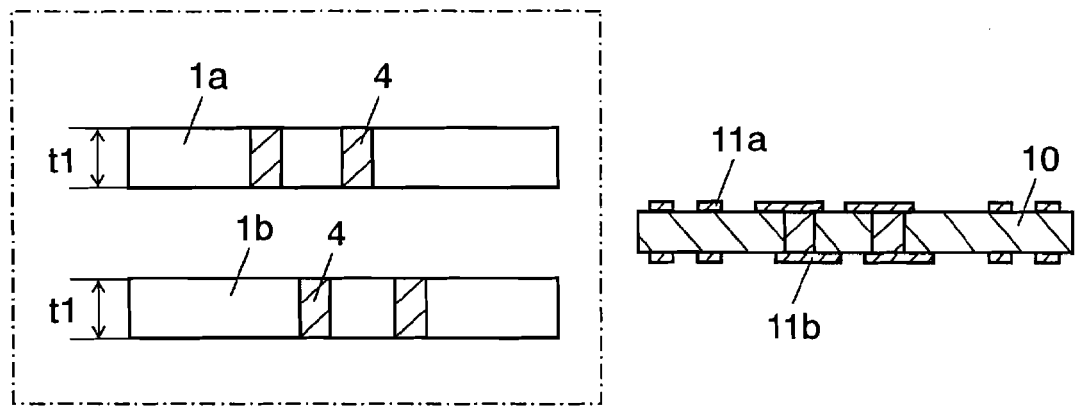
FIG. 1A shows a sectional view of a board material in a method of manufacturing a multi-layer circuit board of an exemplary embodiment of the present invention.

FIG. 1A shows double-sided circuit board 10 as a core circuit board and prepreg sheets 1a, 1b. Double-sided circuit board 10 (with a thickness of approx. 84 μm) has circuit patterns 11a and 11b formed in the process shown in FIGS. 2A through 2F. Prepreg sheets 1a and 1b (with a thickness of approx. 70 μm each) have through-holes 3 filled with conductive paste 4 formed in the process shown in FIGS. 2A through 2D. That is, double-sided circuit board 10 is not less than one time as thick as prepreg sheet 1a(1b).

Prepreg sheets 1a and 1b are disposed on both sides of double-sided circuit board 10 to form laminated member 100.

Figure 1B:
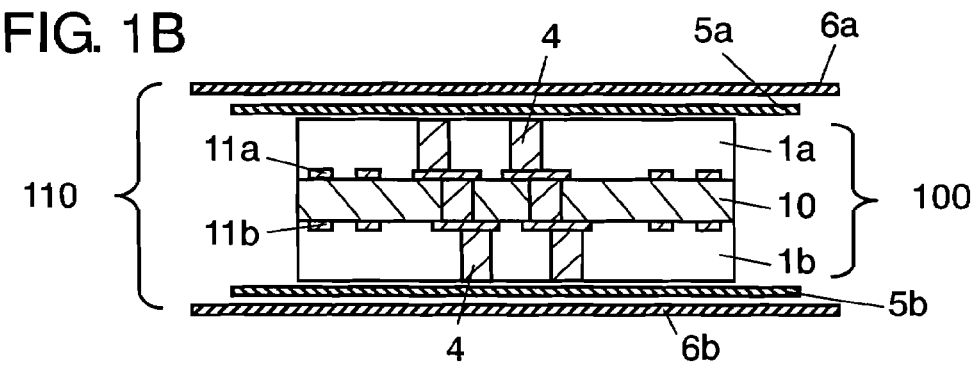
FIG. 1B shows a sectional view the board material in the method of manufacturing a multi-layer circuit board of the embodiment.

Next, the laminated member above is stacked up, as shown in FIG. 1B, with the following components in the order: lamination plate 6b, metal foil 5b made of copper or the like, prepreg sheet 1b, double-sided circuit board 10, prepreg sheet 1a, metal foil 5a, lamination plate 6a. Laminated structure 110 is thus obtained. Metal foil sheets 5a and 5b are not necessarily contained in laminated structure 110.

The coefficient of linear expansion of double-sided circuit board 10 of the embodiment measured $10 \times 10^{-6}$-$12 \times 10^{-6}$/° C. Considering this, stainless steel having a coefficient of linear expansion of $10 \times 10^{-6}$/° C. was employed for lamination plates 6a and 6b. Each lamination plate is 300 mm×300 mm in size and approx. 1 mm in thickness. Although a coefficient of linear expansion is used as a thermal expansion coefficient, a coefficient of cubical expansion can also be used instead of the coefficient of linear expansion.

Figure 1C:
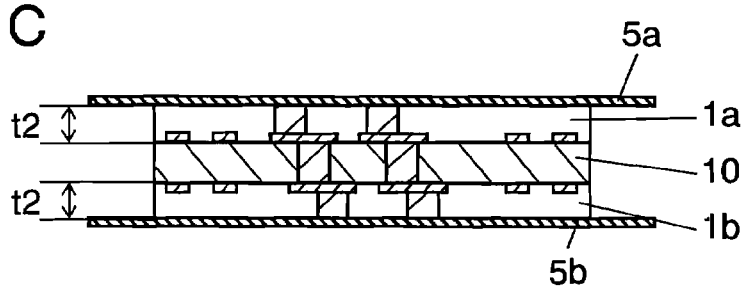
FIG. 1C shows a sectional view of the board material in the method of manufacturing a multi-layer circuit board of the embodiment.
Figure 1D:
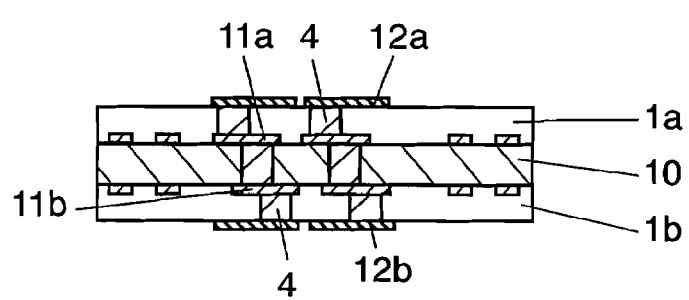
FIG. 1D shows a sectional view of the board material in the method of manufacturing a multi-layer circuit board of the embodiment.

Next, as shown in FIG. 1C, the laminated structure is placed at a predetermined position on a heat press plate (not shown), with the outside of lamination plates 6a and 6b protected by buffer material (not shown), and then compressed with heat. With the application of heat and pressure, prepreg sheets 1a and 1b were compressed down (t2 was approx. 60 μm), metal foil sheets 5a and 5b were bonded with double-sided circuit board 10, and circuit patterns 11a and 11b established inner-via-hole connections to metal foil sheets 5a and 5b via conductive paste 4.

A carrying plate (not shown) with the laminated structure being loaded thereon is heat pressed at the same time. In this case, both the lamination plate and the carrying plate should have a thermal expansion coefficient that is equal to that of the core circuit board. However, when the buffer material can accommodate the difference in thermal expansion coefficient, there is no need to take the coefficient of the carrying plate into consideration. The steps of selecting a lamination plate of the embodiment are as follows.

Step 1 includes preparing double-sided circuit board 10 on which circuit patterns 11a and 11b are mounted.

Step 2 includes measuring thermal expansion coefficient of double-sided circuit board 10 in a range from the room temperature to the heat pressing temperature (for example, 20° C.-120° C.) by using a thermo-mechanical measurement apparatus (TMA) or the like. In step 2, the measurement is carried out at two positions: the area with a remained copper ratio of 100%—the area having metal foil sheets 5a and 5b, and the area with a remained copper ratio of 0%—the area with no metal foil sheets 5a and 5b.

Step 3 includes selecting a lamination plate whose thermal expansion coefficient equals to that of double-sided circuit board 10. To determine the coefficient of circuit board 10, the average of the two values measured in the area having metal foil and the area having no metal foil is calculated. Although the embodiment describes a case in which a double-sided circuit board is employed for a core circuit board, it is not limited thereto. Even when a circuit board having four or more layers is employed for a core circuit board, a lamination plate can be selected in much the way described in Step 1 through Step 3. Besides, it is possible to select a lamination plate whose thermal expansion coefficient is equal to an average value of thermal expansion coefficient of a core circuit board to be used. For each core circuit board, the measurement of thermal expansion coefficient can be carried out once-per-material. The lamination plate selected by the steps above is applicable for a changed product pattern.

Figure 4:
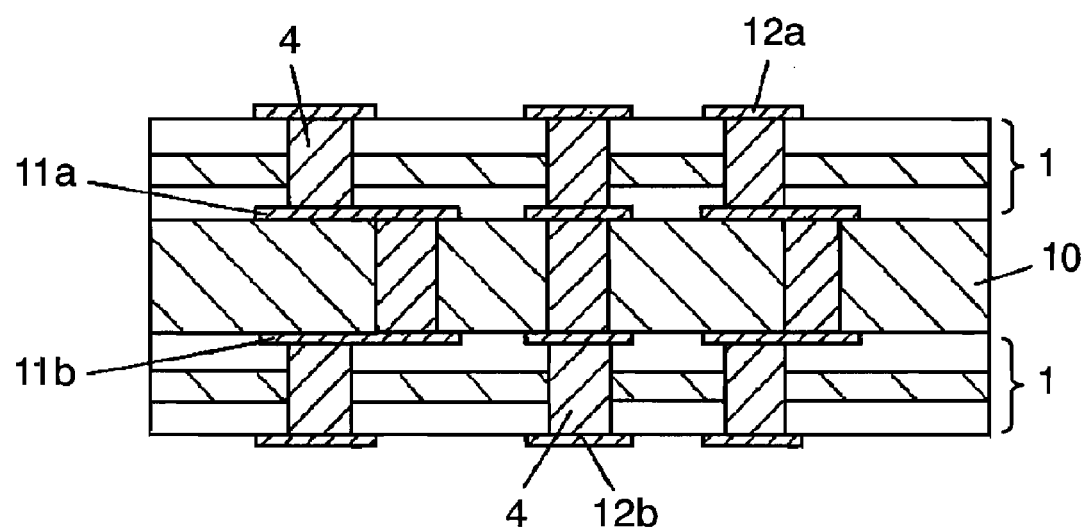
FIG. 4 is a sectional view of conductive paste of the embodiment of the present invention.
Figure 5A:
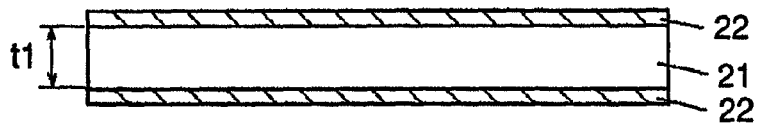
FIG. 5A shows a sectional view of a board material in a conventional method of manufacturing a multi-layer circuit board.
Figure 5B:
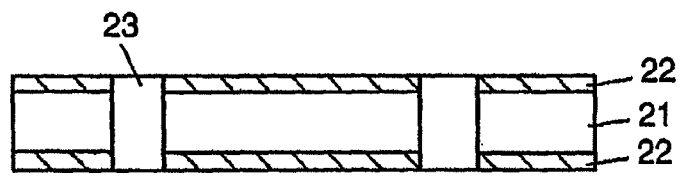
FIG. 5B shows a sectional view of the board material in the conventional method of manufacturing a multi-layer circuit board.
Figure 5C:
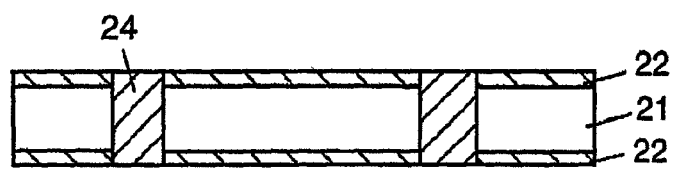
FIG. 5C shows a sectional view of the board material in the conventional method of manufacturing a multi-layer circuit board.
Figure 5D:
FIG. 5D shows a sectional view of the board material in the conventional method of manufacturing a multi-layer circuit board.
Figure 5E:
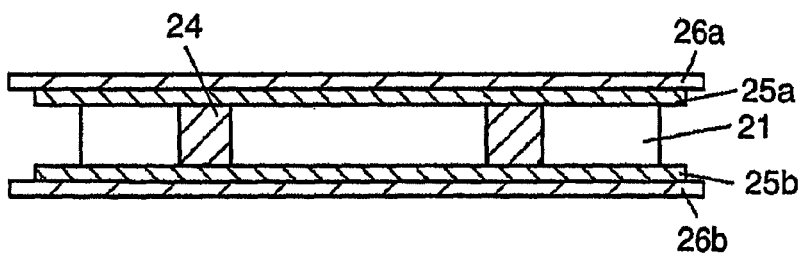
FIG. 5E shows a sectional view of the board material in the conventional method of manufacturing a multi-layer circuit board.
Figure 5F:
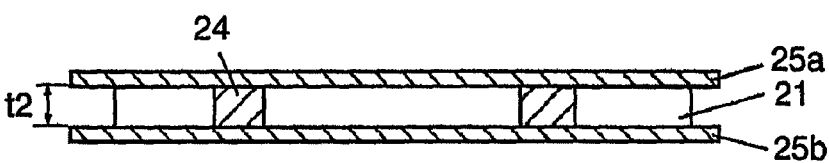
FIG. 5F shows a sectional view of the board material in the conventional method of manufacturing a multi-layer circuit board.
Figure 6A:
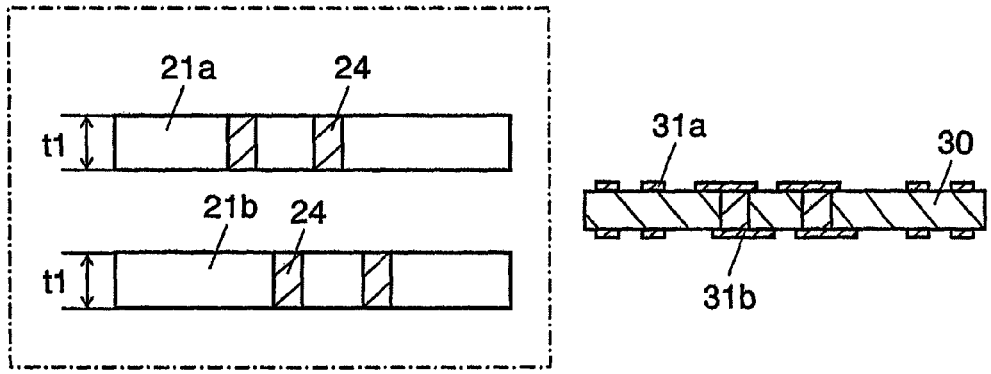
FIG. 6A shows a sectional view of another board material in a conventional method of manufacturing a multi-layer circuit board.
Figure 6B:
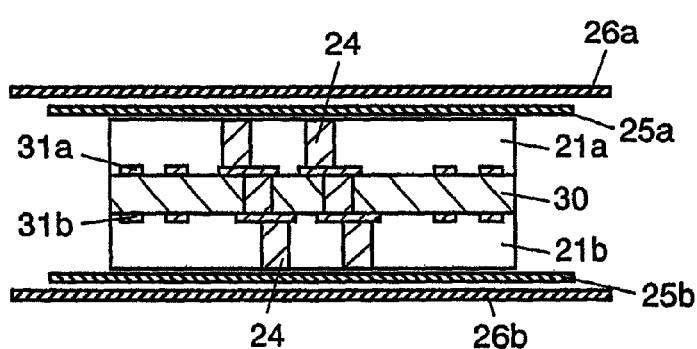
FIG. 6B shows a sectional view of the board material in the conventional method of manufacturing a multi-layer circuit board.
Figure 6C:
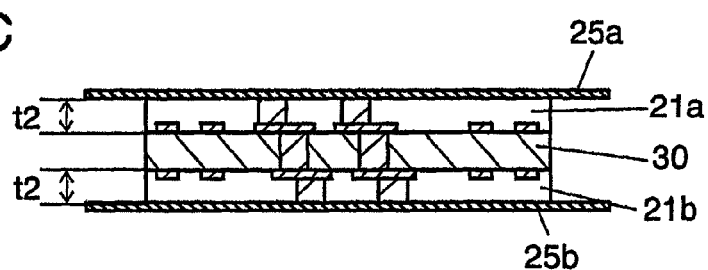
FIG. 6C shows a sectional view of the board material in the conventional method of manufacturing a multi-layer circuit board.
Figure 6D:
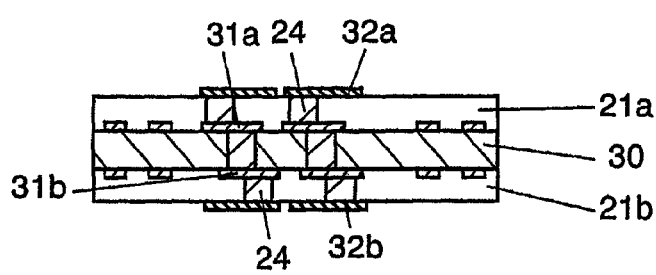
FIG. 6D shows a sectional view of the board material in the conventional method of manufacturing a multi-layer circuit board.

The inventor manufactured 100 pieces of four-layer circuit boards by the method of the embodiment. According to cross-sectional observation by the inventor, there was no lean (distortion) observed in conductive paste 4, as shown in FIG. 4. It shows that selecting a lamination plate with a thermal expansion coefficient equivalent to that of a double-sided circuit board suppresses expansion difference between the two materials when an epoxy resin of a prepreg sheet melts under heat in the heat pressing process.

Besides, by virtue of there being no distortion in the conductive paste, connection resistance is consistently kept in a proper condition. When a metal foil sheet with a different thermal coefficient is employed, the metal foil sheet often has wrinkles thereon because of being drawn by a lamination plate in a direction as the lamination plate expands. However, the method of the present invention can protect metal foil from having wrinkles caused from differences in the thermal expansion coefficient.

Furthermore, by virtue of the conductive paste having no distortion and having a reliable connection resistance, a board material can contain an increased amount of epoxy resin, thereby enhancing proper covering of a circuit pattern on a core circuit board.

The manufacturing method of the present invention is also effective in a four-layered board or six-layered board employed for a core circuit board, as well as in a double-sided circuit board.

In general, the more layers a core circuit board contains, the more rigid the core circuit board becomes, accordingly, the greater the difference in the thermal expansion coefficient between the core circuit board and the lamination plate becomes. The method of the present invention is especially effective in such a case.

Furthermore, the method is also effective in employing a prepreg sheet in which resin layers are formed on both polyamide fiber layers so as to have a thickness of at least 10 μm each, that is, with a total thickness of at least 20 pm.

The prepreg sheet used in the embodiment is a composite material formed of a non-woven fabric having aromatic polyamide fiber impregnated with thermosetting resin. With the method of the invention, a prepreg sheet with a thickness of 60 μm or less can be employed. This allows a multi-layer circuit board to have a thinner structure.

According to the method, as described so far, a lamination plate is selected so as to have a thermal expansion coefficient equivalent to that of a core circuit board. When epoxy resin melts under heat pressing, by virtue of the equivalence in the thermal expansion coefficient between the lamination plate and the core circuit board in a region with small grip strength, conductive paste is free from distortion. As a result, a high-quality multi-layer circuit board with reliable connection resistance can be obtained.

The prepreg sheet and the core circuit board of the embodiment are formed of a composite material of a non-woven fabric having aromatic polyamide fiber impregnated with thermosetting epoxy resin. Instead of non-woven fabric material, a prepreg sheet and a core circuit board formed of a woven fabric can be employed. As a possible material selection, a composite material of a non-woven fabric having aromatic polyamide fiber impregnated with thermosetting epoxy resin, an inorganic material-based non-woven, or a woven fabric impregnated with thermosetting epoxy resin (for example, a glass-epoxy sheet) can be used. Further, an organic base film or base sheet having thermosetting epoxy resin layers formed on both surfaces can be used. Even when a prepreg sheet and a core circuit board formed of the materials above are employed, as long as selecting a lamination plate having thermal expansion coefficient equivalent to that of a core circuit board, the effect similar to that can be expected. Particularly, a B-staged prepreg sheet formed of a glass fiber-woven fabric can offer a physically reinforced multi-layer circuit board.

Compared to a prepreg sheet made of a non-woven fabric, a woven fabric-made prepreg sheet easily forms a resin layer in a region close to the surface of the prepreg sheet. The structure further enhances the effect of the present invention—considerably effective in protecting conductive paste from distortion, and accordingly, providing a high-quality multi-layer circuit board with reliable connection resistance. At the same time, it can realize a multi-layer circuit board having further layers increased in number.

Although the core circuit board and the prepreg sheet are made of the same material in the embodiment, the embodiment is not limited thereto. Even when they are different in material composition, as long as a lamination plate is selected so as to have a thermal expansion coefficient equivalent to that of the core circuit board, a similar effect can be obtained.

Although the description is given on a stacked-up structure with the core being centered, a structure laminated in a lump of a plurality of prepreg sheets and a plurality of core circuit boards can be processed with this method. In this case, too, selecting a lamination plate whose thermal expansion coefficient is equivalent to that of the core circuit board offers the similar effect.

The method of manufacturing a multi-layer circuit board, as described above, can protect conductive paste from a lean, i.e., distortion in heat pressing, enhancing reliable connection quality. The method is widely applicable to multi-layer circuit boards that establish inner via-hole connection via conductive paste.

The invention claimed is:

1. A method of manufacturing a multi-layer circuit board in which a core circuit board having a circuit pattern thereon and a prepreg sheet having a through-hole filled with conductive paste are laminated, the method comprising:
    forming a laminated structure from (i) a laminated member including the core circuit board and the prepreg sheet and (ii) a pair of lamination plates, the laminated member being sandwiched between the pair of lamination plates;
    applying heat and pressure to the laminated structures;
    measuring the thermal expansion coefficient of the core circuit board; and
    selecting the pair of lamination plates such that the thermal expansion coefficient of the pair of lamination plates is equivalent to the measured thermal expansion coefficient of the core circuit board,
    wherein a thermal expansion coefficient of the core circuit board is in a range of $10\times10^{-6}/°$ C. to $12\times10^{-6}/°$ C.,
    wherein the laminated member further includes a layer of metal foil on both surfaces thereof that are sandwiched between the pair of lamination plates, such that each layer of metal foil is sandwiched between the pair of lamination plates,
    wherein the metal foil is made of copper, and the thermal expansion coefficient of the pair of lamination plates is smaller than a thermal expansion coefficient of the metal foil.

2. The method of manufacturing a multi-layer circuit board of claim 1, wherein the prepreg sheet includes a base and two resin layers being impregnated with the base, and wherein a total thickness of the two resin layers formed on both surfaces of the base is at least 20 μm.

3. The method of manufacturing a multi-layer circuit board of claim 1, wherein the core circuit board includes at least four layers.

4. The method of manufacturing a multi-layer circuit board of claim 1, wherein the core circuit board is not less than one times a thickness of the prepreg sheet.

5. The method of manufacturing a multi-layer circuit board of claim 1, wherein the laminated member is formed from the core circuit board and the prepreg sheet being alternately laminated, so as to have two or more layers.

6. The method of manufacturing a multi-layer circuit board of claim 1, wherein:
    a buffer material is disposed at an outside of the laminated structure;
    the laminated structure is placed on a carrying plate;
    the laminated structure undergoes heat and pressure through the buffer material and the carrying plate; and
    a thermal expansion coefficient of the carrying plate equals the thermal expansion coefficient of the pair of lamination plates.

7. The method of manufacturing a multi-layer circuit board of claim 1, wherein:
    a buffer material is disposed at an outside of the laminated structure;
    the laminated structure is placed on a carrying plate;
    the laminated structure undergoes heat and pressure through the buffer material and the carrying plate; and
    the buffer material is formed of a material capable of accommodating a difference in the thermal expansion of the pair of lamination plates and a thermal expansion of the carrying plate.

8. The method of manufacturing a multi-layer circuit board of claim 1, wherein the prepreg sheet includes a base impregnated with a resin and wherein a layer of the resin is formed on both surfaces of the base.

9. The method of manufacturing a multi-layer circuit board of claim 1, wherein the prepreg sheet is a B-staged prepreg in which a woven fabric base is impregnated with a thermosetting resin.

10. The method of manufacturing a multi-layer circuit board of claim 1,
    wherein the core circuit board has predetermined circuit pattern.

11. The method of manufacturing a multi-layer circuit board of claim 10, wherein the measuring of the thermal expansion coefficient of the core circuit board includes measuring the thermal expansion coefficient of the core circuit board (i) at two or more positions of the circuit pattern on the core circuit board and (ii) in a range from room temperature to a heat pressing temperature, the measuring being conducted using a thermo-mechanical measurement apparatus.

12. The method of manufacturing a multi-layer circuit board of claim 10, wherein:
    the measuring of the thermal expansion coefficient of the core circuit includes measuring the thermal expansion coefficient of the core circuit board at two or more positions; and
    the method further comprises:
    calculating an average value of the thermal expansion coefficient of the core circuit board according to the measurement carried out at the two or more positions; and
    selecting the pair of lamination plates such that the thermal expansion coefficient of the pair of lamination plates is equivalent to the calculated average value of the thermal expansion coefficient.

13. The method of manufacturing a multi-layer circuit board of claim 1,
    wherein the thermal expansion coefficient of the pair of lamination plates has a permissible range of ±20% with respect to the thermal expansion coefficient of the core circuit board, and
    wherein a thickness of the prepreg sheet is approximately 70 μm.

14. The method of manufacturing a multi-layer circuit board of claim 13, wherein the thickness of the prepreg sheet after pressing is approximately 60 μm.

* * * * *